US011069212B2

(12) United States Patent
Hallwass-Fedder

(10) Patent No.: US 11,069,212 B2
(45) Date of Patent: Jul. 20, 2021

(54) HOUSING FOR A FIRE ALARM AND/OR EXTINGUISHING CONTROL STATION

(71) Applicant: MINIMAX GMBH & CO. KG, Bad Oldesloe (DE)

(72) Inventor: Bernd Hallwass-Fedder, Hamburg (DE)

(73) Assignee: Minimax GmbH & Co. KG, Bad Oldesloe (DE)

( * ) Notice: Subject to any disclaimer, the term of this patent is extended or adjusted under 35 U.S.C. 154(b) by 0 days.

(21) Appl. No.: 16/496,905

(22) PCT Filed: Mar. 29, 2018

(86) PCT No.: PCT/EP2018/058094
§ 371 (c)(1),
(2) Date: Sep. 23, 2019

(87) PCT Pub. No.: WO2018/184981
PCT Pub. Date: Oct. 11, 2018

(65) Prior Publication Data
US 2020/0128682 A1 Apr. 23, 2020

(30) Foreign Application Priority Data
Apr. 3, 2017 (DE) ...................... 10 2017 107 129.6

(51) Int. Cl.
*G08B 17/00* (2006.01)
*A62C 37/00* (2006.01)
(52) U.S. Cl.
CPC .............. *G08B 17/00* (2013.01); *A62C 37/00* (2013.01)
(58) Field of Classification Search
CPC ........................... H05K 5/0017; H05K 5/0226
See application file for complete search history.

(56) References Cited

U.S. PATENT DOCUMENTS 4,839,527 A * 6/1989 Leitch .................. G08B 17/103
250/227.23
9,496,697 B1 * 11/2016 Wentworth .......... H05K 5/0247
(Continued)

FOREIGN PATENT DOCUMENTS

DE      71 04 688      2/1971
DE      83 34 493.4      2/1984
(Continued)

OTHER PUBLICATIONS

International Searching Authority, International Search Report in German & English translation in International Appln. No. PCT/EP2018/058094, dated Jun. 19, 2018, 5 pages.

*Primary Examiner* — Jinhee J Lee
*Assistant Examiner* — Douglas R Burtner
(74) *Attorney, Agent, or Firm* — Perkins Coie LLP

(57) ABSTRACT

The present invention relates to a housing for a fire alarm and/or extinguishing control station having a housing body (20), which comprises an opening (22) on a front side (24), a housing door (30) for closing the opening (22) and a hinge arrangement (40), which is configured to allow opening and closing of the housing door (30). The housing door (30) has an outer face (32), which faces an observer when the housing body (20) is closed and an inner face (34) which is opposite the outer face (32), wherein the housing door (30) has an indicator and/or operating component (36) on the outer face (32). The hinge arrangement (40) has a first axis of rotation (41) and parallel thereto a second axis of rotation (42) and is designed such that the first and the second axes of rotation (42) can be rotated in opposing directions when the housing door (30) is opened such that the outer face (32) of the housing door (30) and an interior (12) of the housing (10) are simultaneously facing the observer when the housing (10) is in the open state.

15 Claims, 11 Drawing Sheets

(56) References Cited

U.S. PATENT DOCUMENTS

| | | | | |
|---|---|---|---|---|
| 9,656,107 B2* | 5/2017 | Zlatintsis | ............... | A62C 37/46 |
| 2003/0039094 A1* | 2/2003 | Sarkinen | .............. | H05K 5/0226 |
| | | | | 361/679.27 |
| 2006/0145576 A1* | 7/2006 | Lee | ........................ | F16M 11/24 |
| | | | | 312/406 |
| 2015/0231432 A1* | 8/2015 | Zlatintsis | ............... | A62C 37/42 |
| | | | | 169/61 |
| 2016/0286672 A1* | 9/2016 | Wolf | .................... | H05K 5/0017 |
| 2017/0092405 A1* | 3/2017 | Manahan | ............. | H05K 5/0213 |
| 2017/0347473 A1* | 11/2017 | Freer | .................. | B01D 53/0454 |
| 2018/0048132 A1* | 2/2018 | Dinh | .................. | H05K 5/0226 |
| 2020/0279467 A1* | 9/2020 | Sherman | .................. | G08B 3/10 |

FOREIGN PATENT DOCUMENTS

| | | |
|---|---|---|
| DE | 28 47 135 C3 | 1/1985 |
| DE | 38 09 487 C1 | 4/1989 |
| DE | 693 30 468 T2 | 4/2002 |
| DE | 10 2008 020 729 B3 | 12/2009 |
| DE | 10 2015 220 064 A1 | 5/2016 |

* cited by examiner

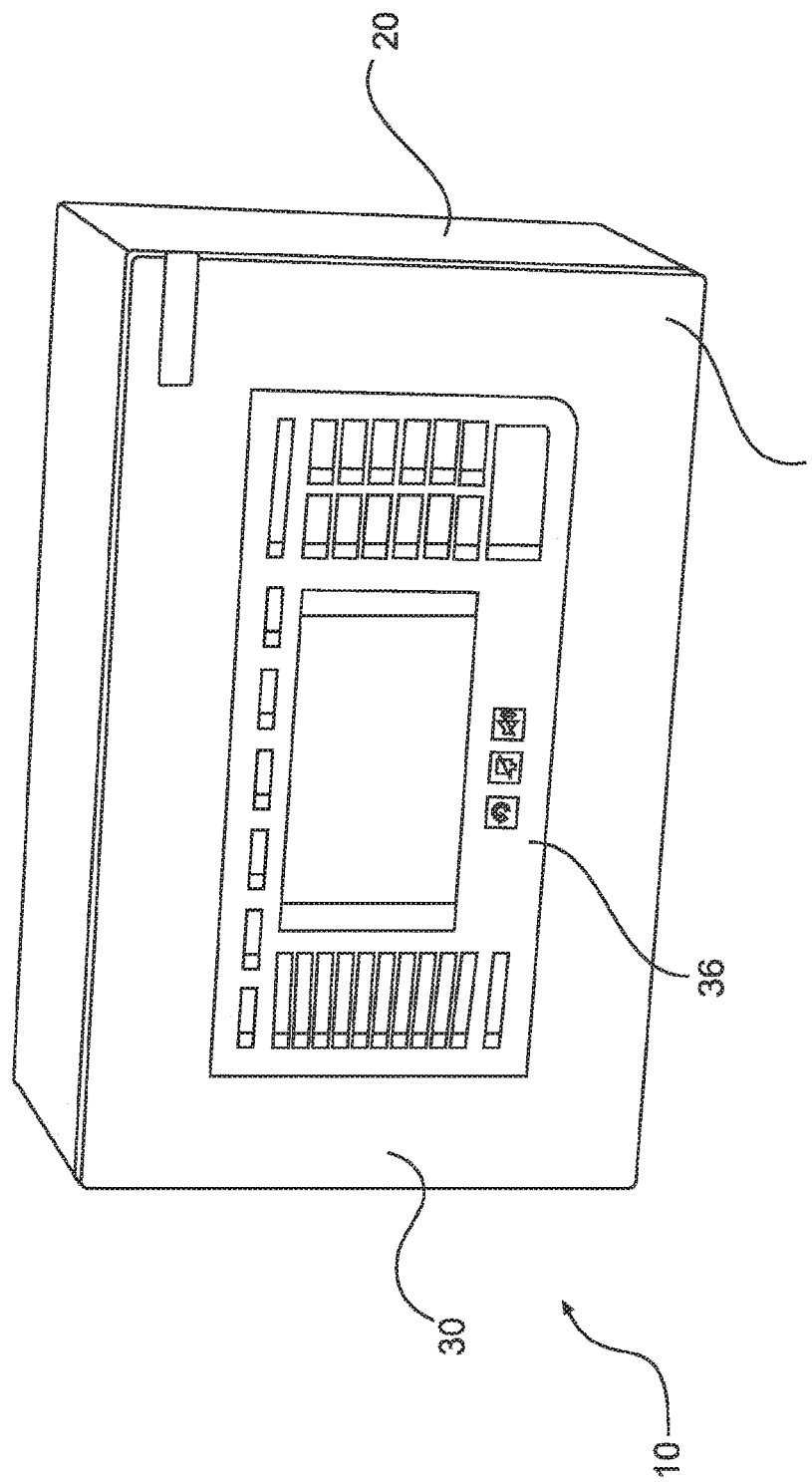

HOUSING FOR A FIRE ALARM AND/OR EXTINGUISHING CONTROL STATION

PRIORITY CLAIM AND INCORPORATION BY REFERENCE

This application is a 35 U.S.C. § 371 application of International Application No. PCT/EP2018/058094, filed Mar. 29, 2018, which claims the benefit of German Application No. 10 2017 107 129.6 filed Apr. 3, 2017, each of which is incorporated by reference in its entirety.

TECHNICAL FIELD

The present invention relates to a housing of a fire alarm and/or extinguishing control station.

BACKGROUND AND SUMMARY OF THE INVENTION

Fire alarms and/or extinguishing control stations are known. The central components of the fire alarm and/or extinguishing control station are arranged in one or more housings, wherein this housing is installed at a location which is also accessible in the event of an alarm.

It is also known that fire alarm and/or extinguishing control stations have a display component and/or operating component via which, for example, configurations can be carried out and/or an association of malfunctions or alarms with an associated detector or participant can be carried out.

If the display and/or operating component is arranged inside the housing, a rapid identification, for example, of an alarm location or a fire location is prevented since emergency personnel first have to open the housing before they determine the location by means of the display and/or operating component.

If the display and/or operating component is arranged externally on a front side of the housing, there are disadvantages for the device, operation and maintenance of the fire alarm and/or extinguishing control station, for example, in the event of a malfunction. A service technician who seeks a malfunction indicated on the outer side of the housing regularly has to open the housing and carry out maintenance operations inside the housing. Whilst the housing is open and the service technician has access to the inner side of the housing, the service technician cannot then see the display and/or operating component, which is located at the outer side of the housing door facing away from the service technician. At the same time, the service technician, when he observes the display and/or operating component or interacts with it, that is to say, for example, when the housing is closed, has no access to the components inside the housing. The efficiency of the maintenance is thereby limited.

Against this background, an object of the present invention was to improve a housing of a fire alarm and/or extinguishing control station in such a manner that disadvantages known from the prior art are overcome. It was further an object of the present invention to enable simplified maintenance of a fire alarm and/or extinguishing control station.

As a solution, according to the invention a housing of a fire alarm and/or extinguishing control station is provided, wherein the housing has: a housing body which has an opening at a front side and which defines an inner space of the housing; a housing door for closing the opening of the housing body; and a hinge device which is configured to enable opening and closing of the housing door. The housing door has an outer side, which faces an observer when the housing body is closed and an inner side opposite the outer side. The housing door has at the outer side a display and/or operating component. The hinge device has a first rotation axis and a parallel second rotation axis. The hinge device is constructed in such a manner that the first rotation axis and the second rotation axis when the housing door is open can be rotated in opposing directions so that, when the housing is in the open state, the outer side of the housing door and the inner space of the housing face the observer at the same time.

By the observer at the same time facing the outer side of the housing door, that is to say, the side which can also be seen from outside when the housing is in the closed state, and the inner space of the housing when the housing is in the open state, it is possible for the user at the same time to access the inner space and to operate or interact with the display and/or operating component. Accordingly, the observer is saved, in order to interact with the display and/or operating component, from regularly having to close the housing door or to change his own position relative to the components of the fire alarm and/or extinguishing control station, for example, when actual maintenance operations are intended to be carried out on the components inside. The efficiency of the maintenance operations is thereby increased. At the same time, an error source can be excluded since the observer can implement information of the display and/or operating elements directly and not indirectly, that is to say, via the intermediate step of his memory. The display and/or operating component may consequently be available as a continuously available support for the maintenance operations, which increases the error security of the maintenance operations.

The rotation about the first rotation axis may be coupled with the rotation about the second rotation axis or enable an independent rotation. The decisive aspect is that the second rotation axis at least partially compensates for the rotation of the first rotation axis by means of which the display and/or operating component rotates away from the observer, that is to say, rotates the orientation of the display and/or operating component in the direction of the observer. It is self-evident that the first and the second rotation axis when the housing door is closed accordingly cooperate in opposing directions.

The fact that the outer side has the display and/or operating component means that the display and/or operating component can be seen or operated from the outer side. To this end, the display and/or operating component is mounted on the outer side and/or preferably mounted in an opening of the housing door, for example, from the inner side. This enables particularly simple assembly of the display and/or operating component.

In an embodiment, an opening direction of the housing door is located in the width direction or in the height direction of the housing. A spacing between the first rotation axis and the second rotation axis is approximately 50% of the extent of the housing body in the width direction or in the height direction.

In the context of this patent application, the term "approximately 50%" is intended to be understood to mean preferably a range from 40% to 60%, in a particularly preferred manner from 45% to 55%.

By the spacing between the first rotation axis and the second rotation axis being approximately 50%, the housing door in the open state may be substantially in abutment with a side of the housing. If a smaller spacing is provided, the housing door will cover a portion of the opening of the housing. If a larger spacing is provided, this leads to a formation of a gap whose extent increases as the spacing between the rotation axes increases, which is undesirable and makes access to the display and/or operating component difficult. The preferred range accordingly represents the ideal compromise between accessibility of the inner side of the housing and proximity of the display and/or operating component.

In an embodiment, the housing body has around the opening a sealing edge which protrudes outward over the front side of the housing body.

Preferably, the housing door in the closed state is positioned at the outer side around the sealing edge on the front side of the housing. To this end, the housing door preferably has a peripheral wall with a larger periphery than the sealing edge. By the sealing edge protruding outward over the front side, it is not necessary to provide a sealing edge inside the housing offset toward the rear. The available space inside the housing can consequently be increased without increasing the outer dimensions of the housing.

In an embodiment, the housing door has at the upper side thereof a gripping element which is constructed as an angular member.

The gripping element may be varied in terms of the width and the configuration thereof and in other embodiments also be arranged at another side of the housing door. An angular member is a particularly simple and visually pleasing configuration which allows a projection which can be easily gripped both at the front side and at the upper side of the housing door.

In an embodiment, the housing body has in the inner space a module bar for fitting modules of the fire alarm and/or extinguishing control station. The hinge device is arranged on a vertical side face of the housing body. The module bar is arranged adjacent to the side face opposite the hinge device.

Access to the module bar and the head of the module bar may be required for maintenance purposes, for example, for installation and disassembly and replacement of modules, etcetera. The space for this access is limited as a result of the fact that the module bar is arranged adjacent to the side face opposite the hinge device, not by the hinge device itself or by the housing door which is connected to the hinge device in the then open state. The ease of maintenance of the fire alarm and/or extinguishing control station is consequently improved.

In an embodiment, the hinge device has two hinge elements each having two vertical rotation axes which are arranged at the inner side both on a side face of the housing body and on the housing door. The hinge device enables vertical pivoting of the housing door in the open state.

Preferably, the first rotation axis enables conventional opening of the housing door, wherein the opening is carried out in particular in the direction of the left side face, but without being limited thereto. The second rotation axis then enables an oppositely directed rotation of the door about a parallel vertical axis independently of a rotation movement about the first rotation axis.

The two hinge elements are preferably arranged parallel with each other and vertically spaced apart from each other, in particular one each in the upper and lower region of the housing body. As a result of the parallel arrangement of two hinge elements, torques acting on the hinge device are reduced.

The two hinge elements are preferably identical, but may also be constructed differently as long as they define the same first and second rotation axes.

It should be taken into account that, in another embodiment, the two hinge elements are arranged at the upper side or also the lower side of the housing body, wherein the housing door can then be pivoted horizontally in the open state.

In an embodiment, the hinge device has four hinge elements, preferably four identical hinge elements, each having two horizontal rotation axes. In each case, two hinge elements are arranged at the inner side on opposing side faces of the housing body. The hinge device enables a parallel guiding of the housing door in a vertical direction.

The parallel guiding couples the rotation about the first rotation axis with an opposing rotation about the second rotation axis so that the housing door is always parallel with the front side of the housing body. The invention is naturally not limited to vertical parallel guides, but guides, for example, parallel guides in other directions are also conceivable.

BRIEF DESCRIPTION OF THE DRAWINGS

Advantages and embodiments of the invention are described below with reference to the appended Figures, in which:

FIG. 1 is a schematic, perspective exemplary view of a housing of a fire alarm and/or extinguishing control station, FIGS. 2a-2e schematically shows different steps of opening a housing door of a housing according to an embodiment, FIGS. 3a-3d schematically show different steps of opening a housing door of a housing according to another embodiment

MODE(S) FOR CARRYING OUT THE INVENTION

Figure 2A:
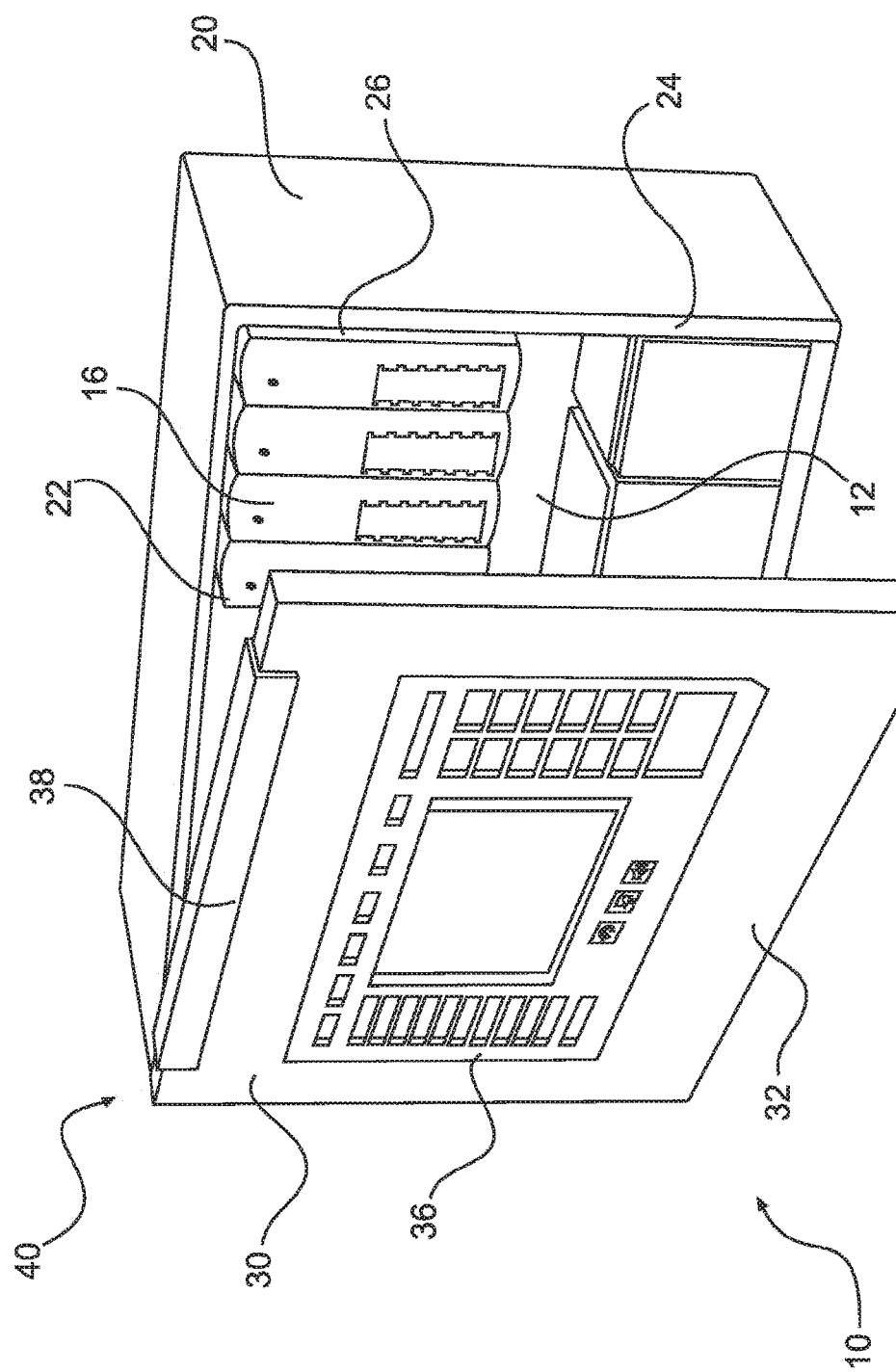

FIG. 1 is a schematic, exemplary illustration of a housing 10 of a fire alarm and/or extinguishing control station. The housing 10 has a housing body 20 which is closed at the front side by a housing door 30. The housing door 30 terminates flush with the housing body 20 at the outer sides so that, in this embodiment, there is no perceptibly protruding transition between the housing body 20 and the housing door 30. The housing 10 is mounted at the application location, for example, in the orientation depicted on a wall. The housing 10 may, however, also have clearly different shapes and, for example, be constructed for erection on a floor.

An outer side 32 of the housing door 30 faces an observer standing in front of the housing 10. A display and/or operating component 36 arranged on the outer side 32 of the housing door 30 enables the observer to obtain important information relating to the fire alarm and/or extinguishing control station, for example, information regarding which participants, for example, fire alarm, signals an alarm or a fire without it being necessary to open the housing 10.

FIGS. 2a to 2e show different steps of an operation for opening the housing door 30 in a first embodiment. The housing 10 substantially corresponds to the housing of FIG. 1, wherein in addition a gripping element 38 which is constructed as an angular member is shown at the upper side of the housing door 30.

In FIG. 2a, the housing 10 is in a partially open state, wherein the housing door 30 is partially rotated about a vertical axis close to a left side face of the housing body 20.

The partially open housing door 30 enables a view through an opening 22 of the housing body 20 into the inner space 12 of the housing 10. In the closed state of the housing 10, the opening 22 is closed by the housing door 30, wherein the housing door 30 surrounds a sealing edge 26 which protrudes from a front side 24 of the housing body. By the sealing edge 26 protruding in front of the front side 24, the usable inner space 12 is increased in comparison with the case in which the sealing edge is provided offset in an inward direction.

In the inner space 12, modules 16 which are part of the fire alarm and/or extinguishing control station are shown by way of example. To the module 16, external components, for example, alarms, extinguishing units, alarm means, etcetera, can be connected by means of limit values lines or other connection lines. Other embodiments of fire alarm and/or extinguishing control stations may also be monolithic and consequently not module-based or a mixture of both.

The opening of the housing door 30 is carried out by means of a hinge device 40 which is still concealed by the housing door 30 in the view of FIG. 2a.

Figure 2B:
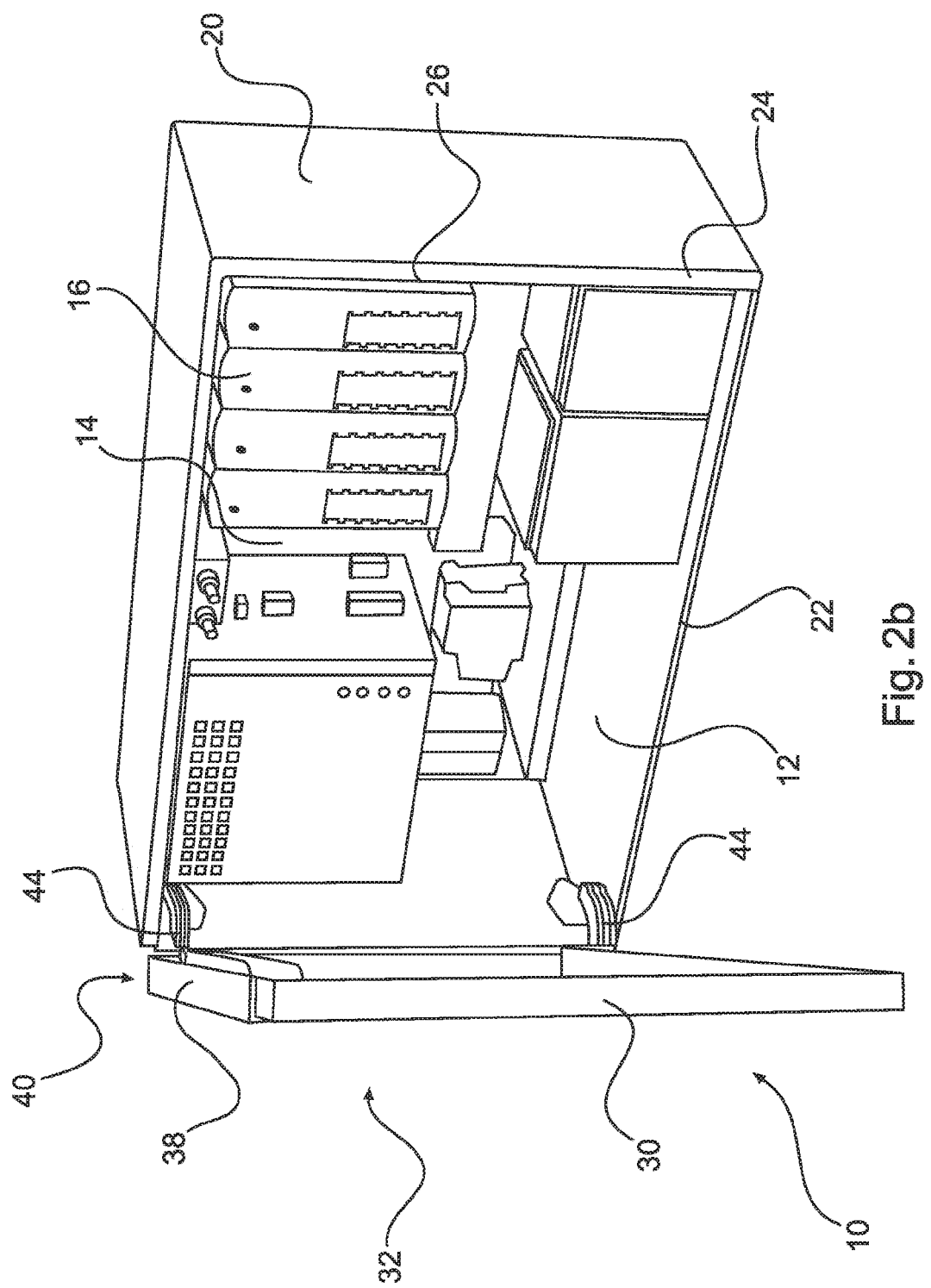
Figure 2C:
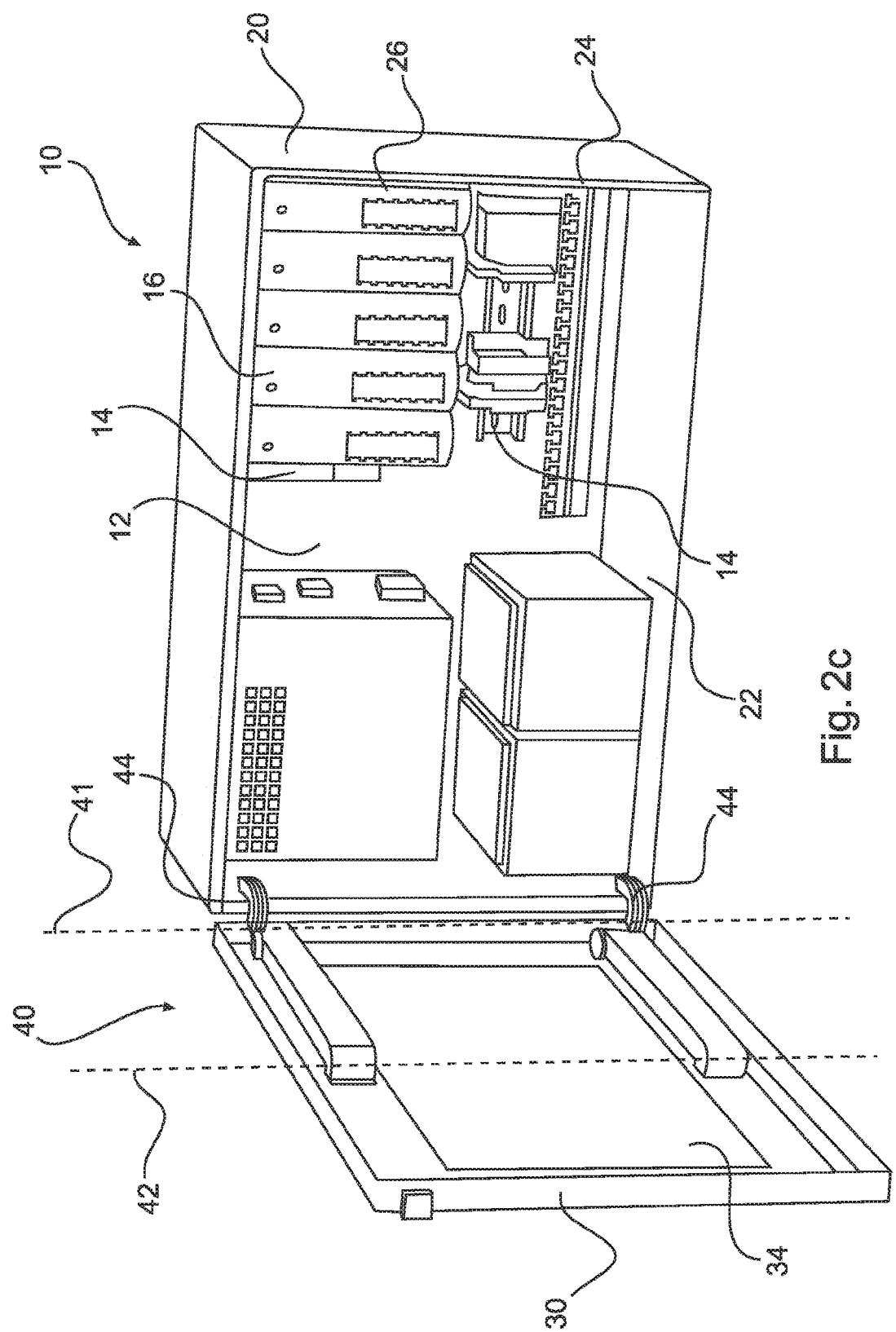

FIGS. 2b and 2c show other views in which the housing door 30 continues to be further opened. In the inner space 12, it is further possible, for example, to see a module bar 14 to which the modules 16 are fitted. Furthermore, two hinge elements 44 of the hinge device 40 can be seen and are fitted at different heights to the left side face of the housing body 20 and an inner side 34 of the housing door 30.

The hinge elements 44 define a first rotation axis 41 and a second rotation axis 42 which are spaced apart from each other by approximately 50% of the width of the housing door 30. Up to the opening position shown in FIG. 2c, an opening of the housing door 30 is carried out only by means of a rotation about the first rotation axis 41. The second rotation axis 42 is unchanged in comparison with the closed position of FIG. 1, that is to say, as far as this position, there was no rotation about the second rotation axis 42.

Figure 2D:
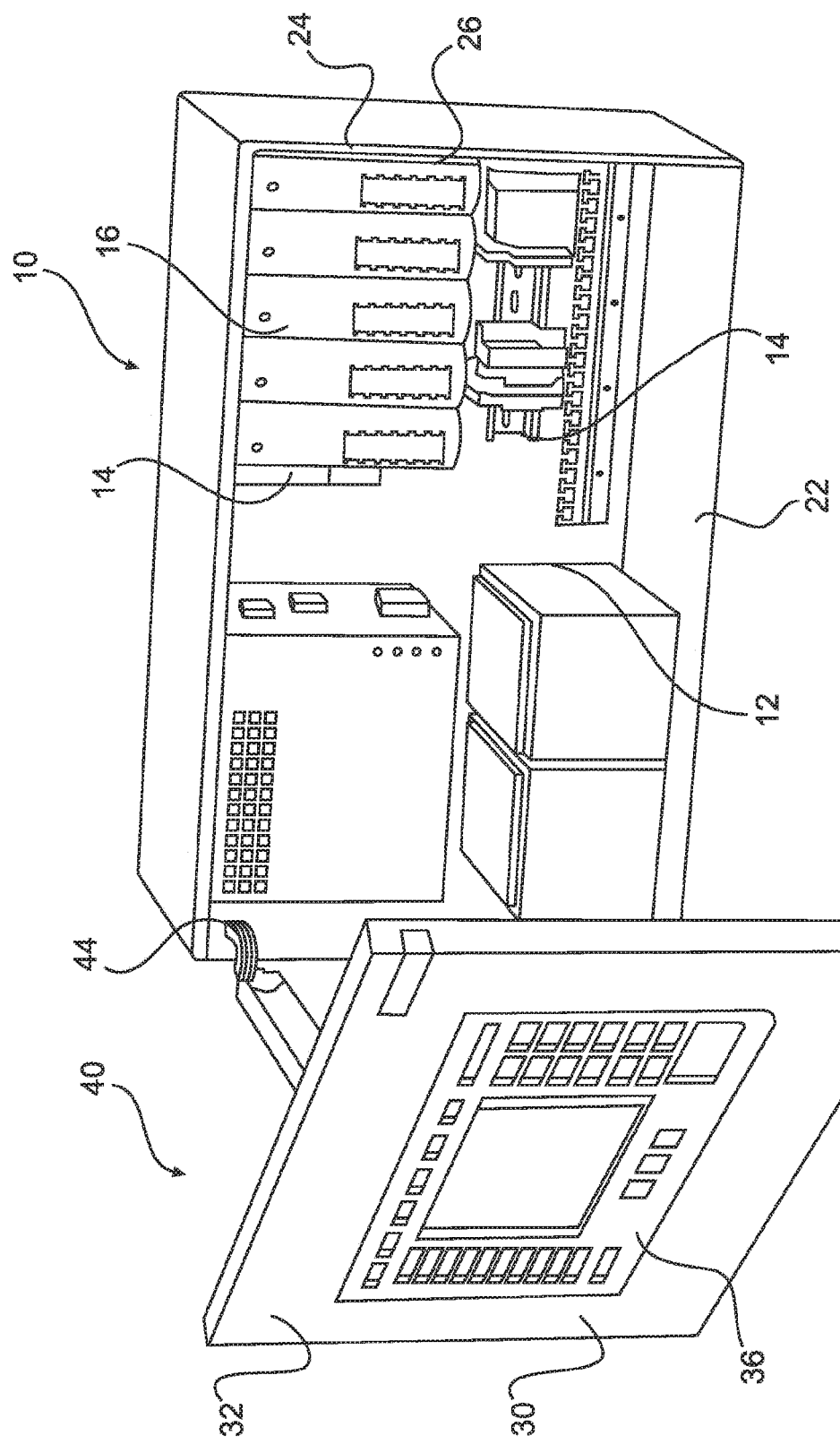
Figure 2E:
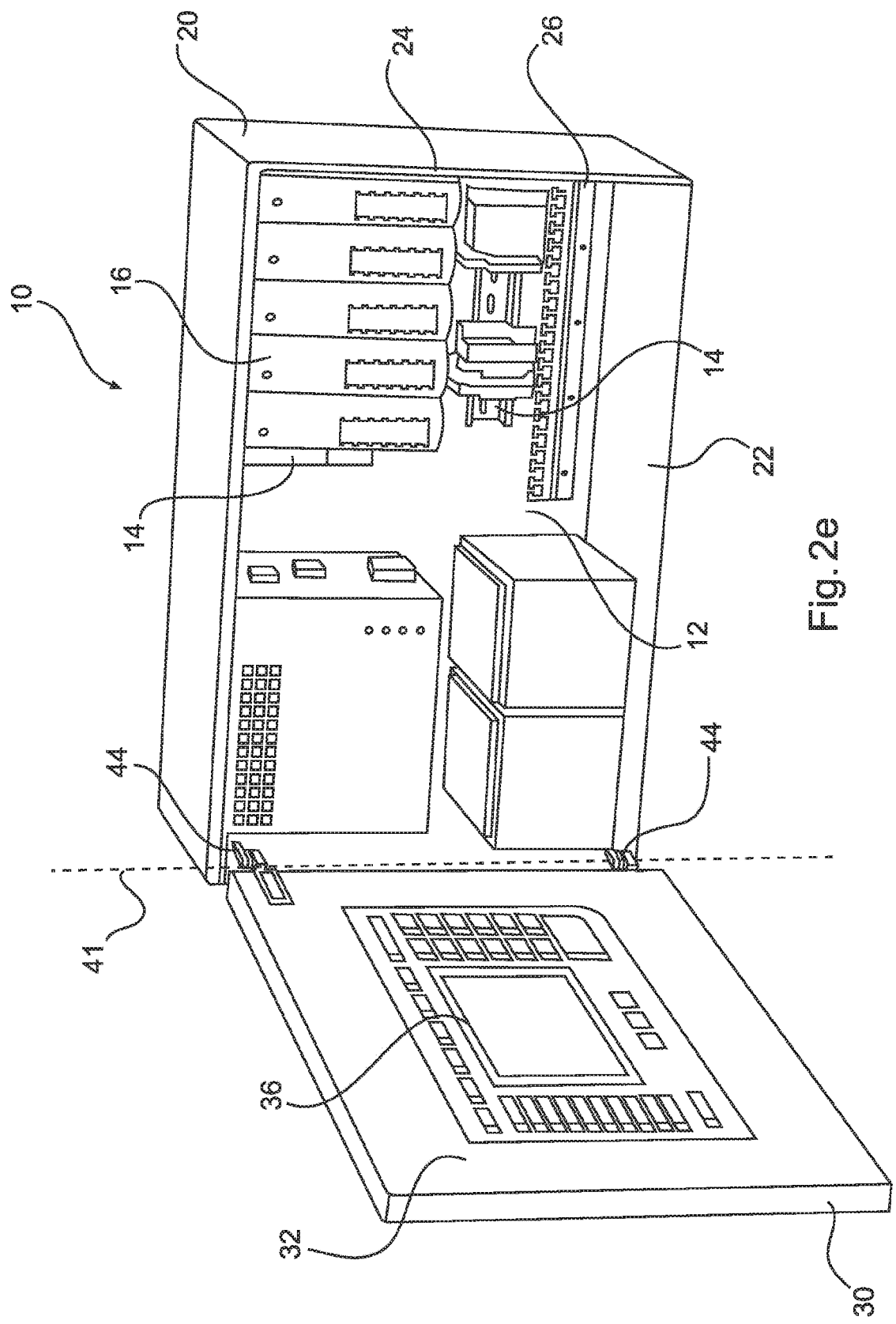

From FIG. 2c to FIG. 2e, the housing door 30 was now pivoted about the second rotation axis 42 back in the direction of the original orientation. In FIG. 2e, the rotation about the second rotation axis 42 is terminated and the outer side 32 including the display and/or operating component 36 is from a position in front of the opening 22 of the housing body 20 at the same time as the inner space 12 within access of an observer, for example, a service technician. By the spacing between the first rotation axis 41 and second rotation axis 42 substantially corresponding to half the housing door 30, the opening 22 is completely accessible and at the same time there is no gap provided between the housing door 30 and housing body 20.

The position with respect to the first rotation axis 41 is identical in FIGS. 2c to 2e shown by way of example and only a rotation about the second rotation axis 42 is illustrated. The rotations about the first rotation axis 41 and second rotation axis 42 may naturally also be combined and carried out at the same time. The first rotation axis 41 may enable any opening angle, for example 180° or more, and is not limited to the opening angle of approximately 100° shown in the example.

The rotation axes may be defined in such a manner that the first rotation axis 41 defines a rotation of the hinge device 40 with respect to the housing body 20, whilst the second rotation axis 42 defines a rotation of the hinge device with respect to the housing door 30. The rotations about the first rotation axis 41 and second rotation axis 42 are additive as a result of the parallel nature of the rotation axes so that the sum of the rotation about the first rotation axis 41 and second rotation axis 42 produces the rotation of the housing door 30 with respect to the housing body 20. As a result of the opposing rotation about both rotation axes, the rotation of the housing door 30 with respect to the housing body 20 is accordingly reduced or even completely cancelled.

FIGS. 3a to 3d are schematic cross-sections of another embodiment of a housing 10 according to the invention. The housing 10 of FIG. 3a to FIG. 3d differs from the example of FIG. 2 in the configuration of the hinge device 40.

Figure 3A:
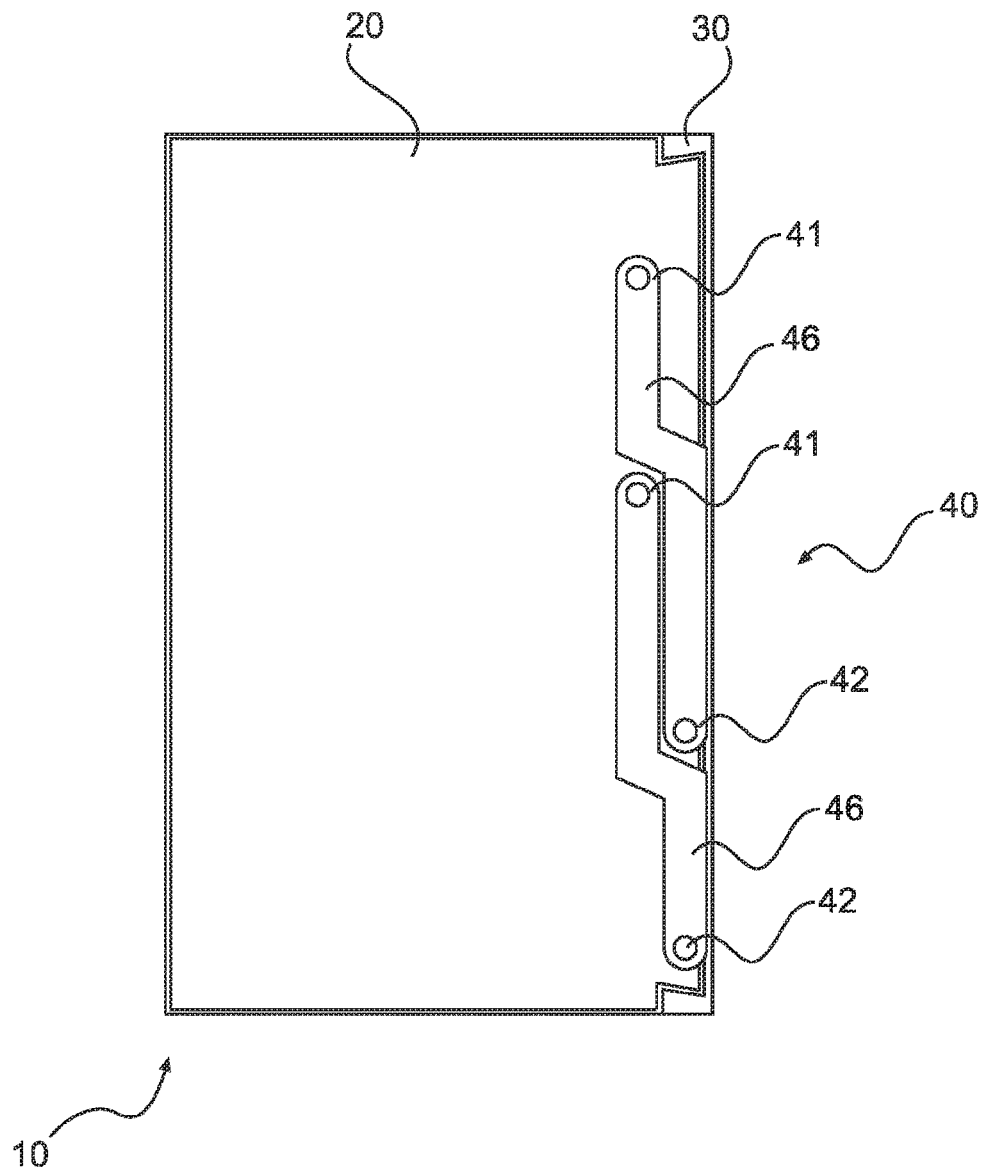
Figure 3B:
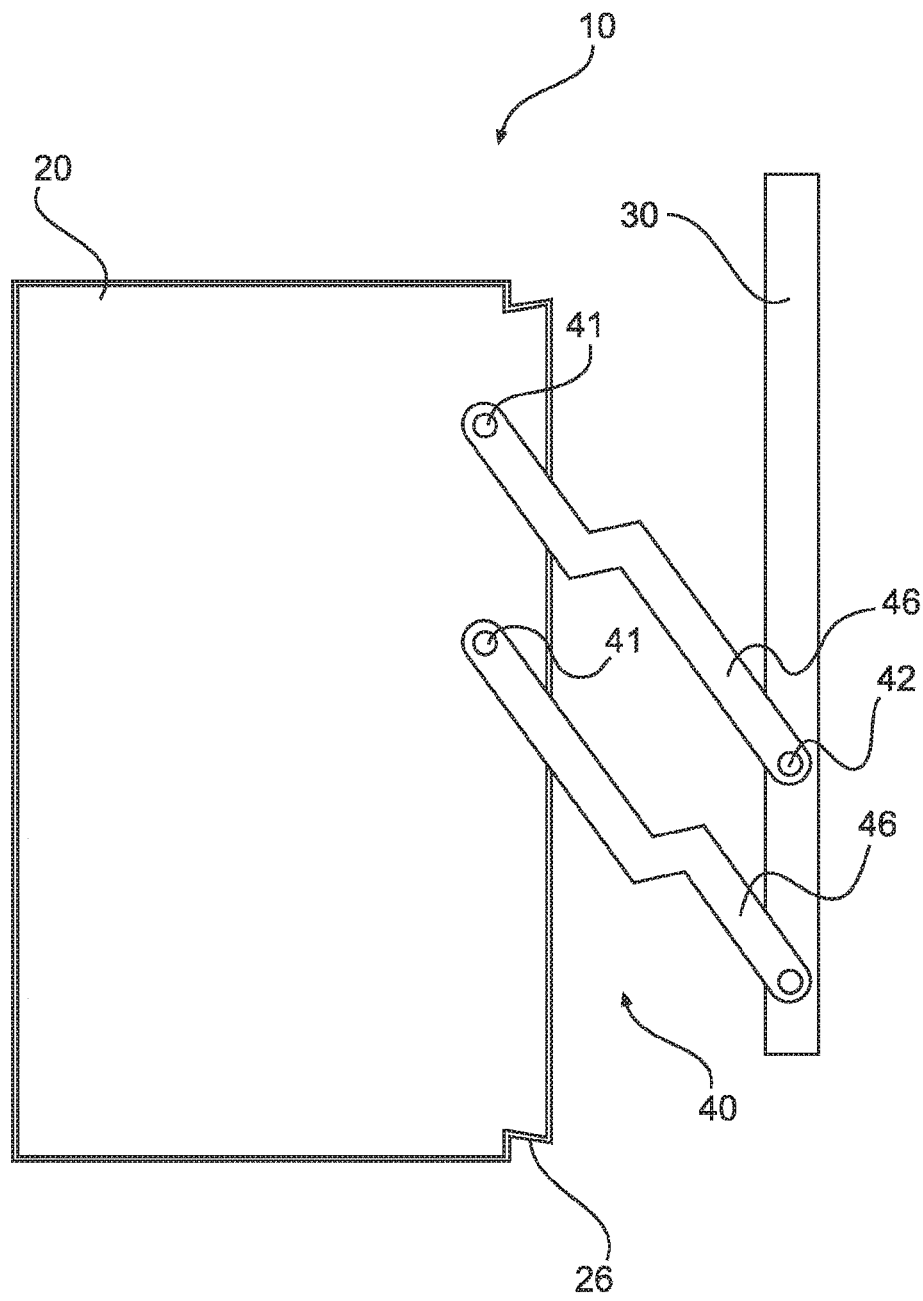
Figure 3C:
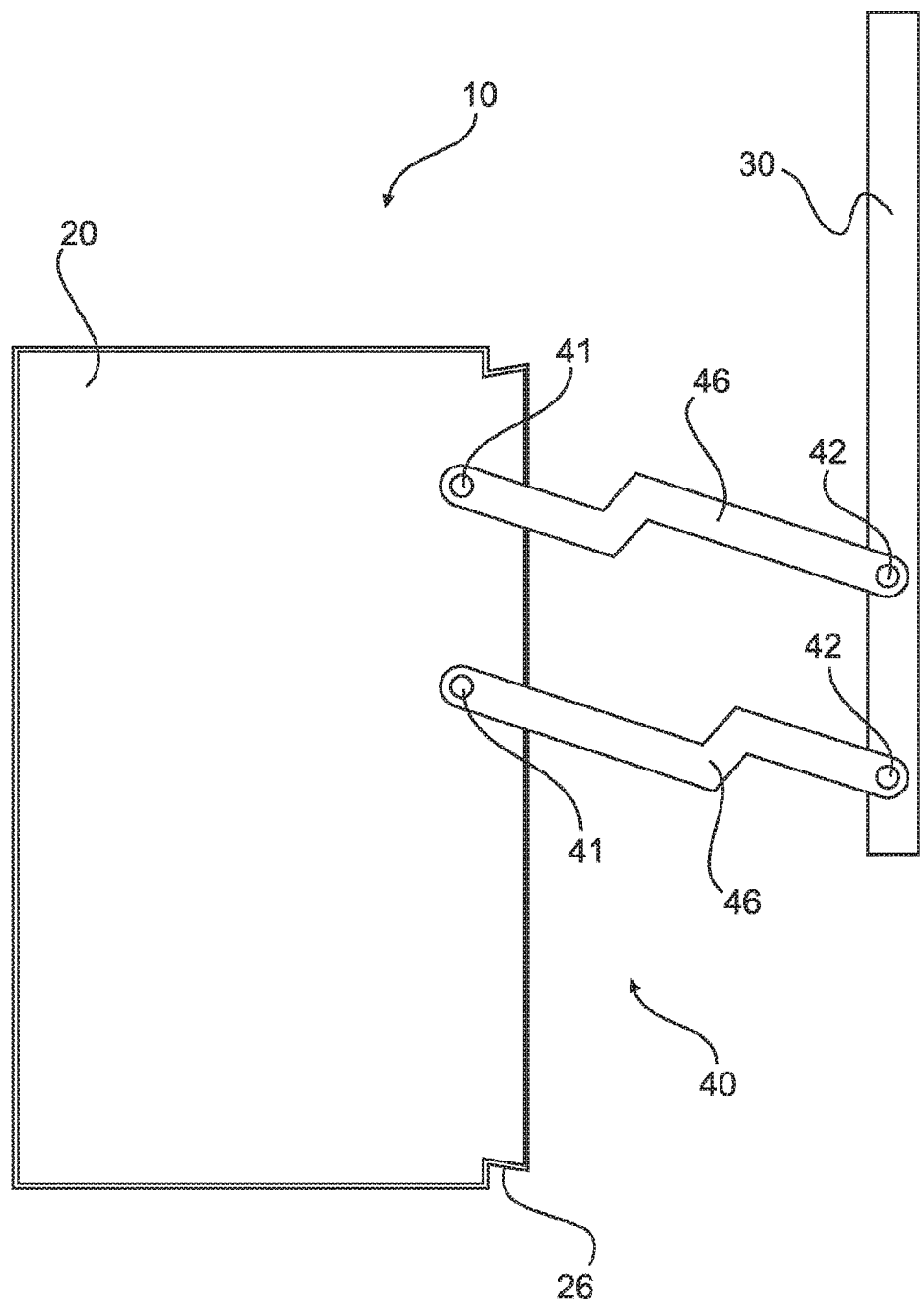
Figure 3D:
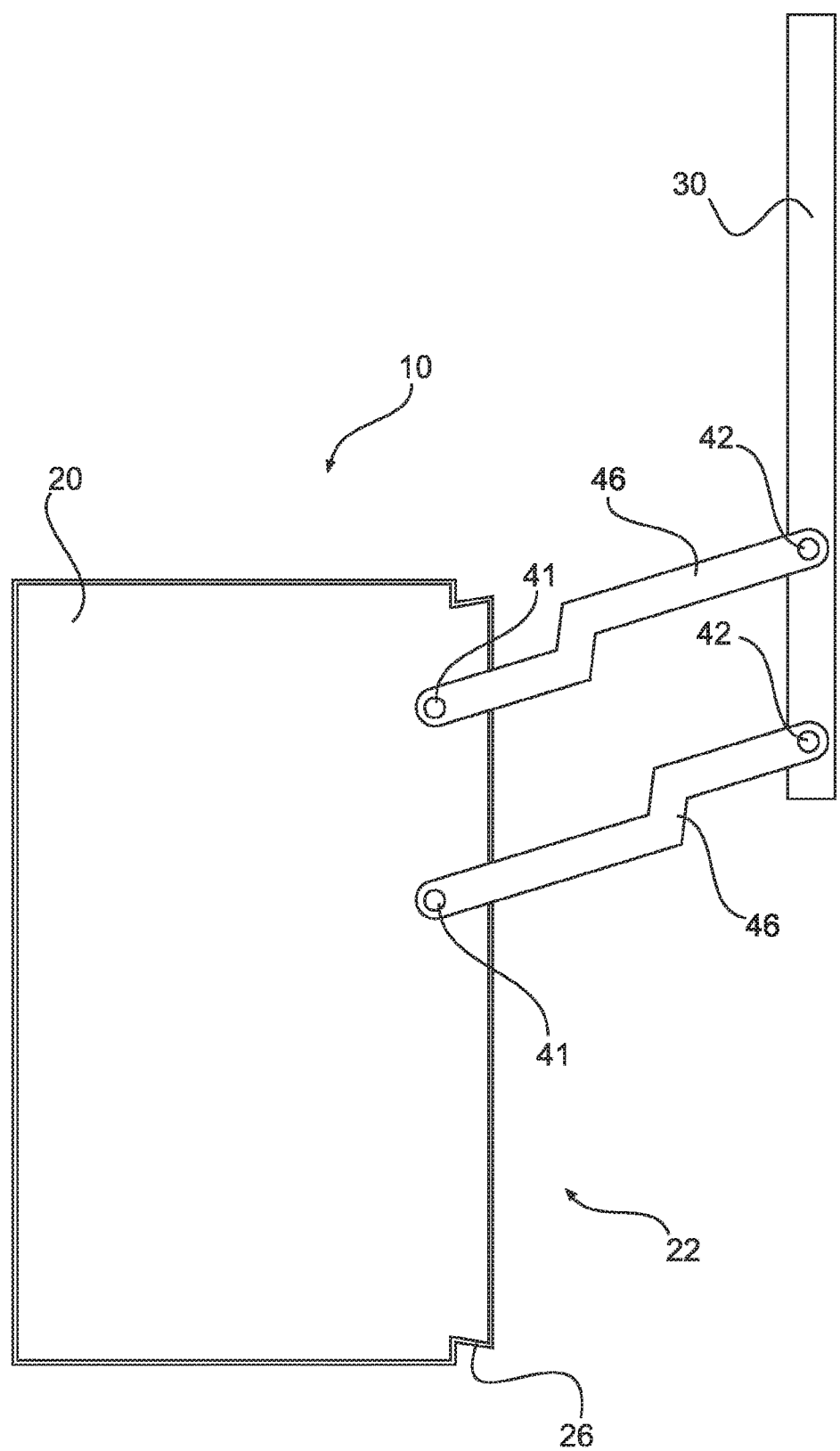

In this embodiment, the hinge device 40 has four preferably identical hinge elements 46 which are each arranged in pairs at a left and right side face of the housing body 20 and which enable a vertical parallel guiding of the housing door 30. The hinge elements 46 are in this embodiment constructed in a staircase-like manner with two steps of different lengths. So that the hinge device 40 in the closed state, which is shown in FIG. 3a, has space inside the housing body 20, the four identical hinge elements 46 are in each case mounted in a mirror-inverted manner, wherein naturally other options of hinge elements 46, which define a parallel guiding are also possible.

The hinge elements 46 are in this embodiment rigid and define two axes at the connections to the housing body 20 or the housing door 30. The first rotation axis 41 is defined at the connection of the hinge elements 46 and housing body 20, the second rotation axis 42 is defined at the connection of the hinge elements 46 and housing door 30.

In the cross-section of FIG. 3, the formation of the sealing edge 26 can be seen particularly clearly. FIGS. 3b to 3d show the housing door 30 with a progressive degree of opening.

Figure 4:
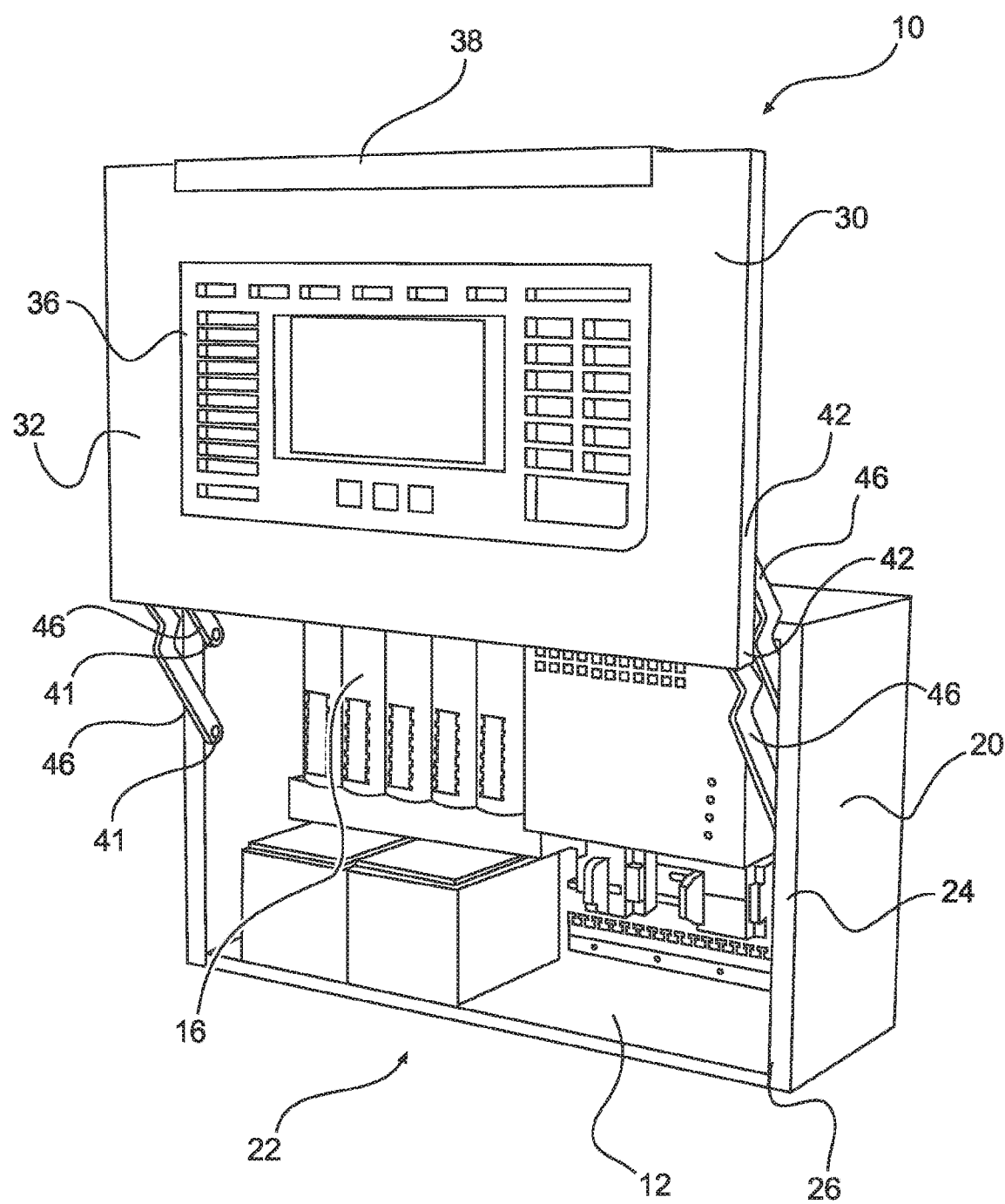
FIG. 4 is a schematic, perspective view of the housing of FIG. 3 in the open state.

Finally, FIG. 4 is a perspective view of the housing door 30 according to the second embodiment in an open state. The arrangement of the components inside the housing 10 is in this instance different from the arrangement of the first embodiment, wherein also any other arrangements of components in housings 10 according to the invention can be used.

LIST OF UTILIZED REFERENCE NUMBERS

10 Housing
12 Inner space
14 Module bar
16 Module
20 Housing body
22 Opening
24 Front side
26 Sealing edge
30 Housing door
32 Outer side
34 Inner side
36 Display and/or operating component
38 Gripping element
40 Hinge device
41 First rotation axis
42 Second rotation axis
44 Hinge element
46 Hinge element

The invention claimed is:

1. A housing of a fire alarm and/or extinguishing control station, the housing comprising:
a housing body, which has an opening at a front side and which defines an inner space of the housing,
a housing door for closing the opening of the housing body and a hinge device which is configured to enable opening and closing of the housing door, wherein the housing door has an outer side which faces an observer when the housing body is closed and an inner side opposite the outer side, wherein the housing door has at the outer side a display and/or operating component, wherein the hinge device has a first rotation axis external the housing body and a parallel second rotation axis external the housing body, and wherein the hinge device is constructed in such a manner that the first rotation axis and the second rotation axis when the housing door is open can be rotated in opposing directions so that, when the housing is in the open state, the outer side of the housing door and the inner space of the housing face the observer at the same time.

2. The housing as claimed in claim 1, wherein an opening direction of the housing door is located in the width direction or in the height direction of the housing, and wherein a spacing between the first rotation axis and the second rotation axis is approximately 50% of the extent of the housing body in the width direction or in the height direction.

3. The housing as claimed in claim 1, wherein the housing body has around the opening a sealing edge which protrudes outward over the front side of the housing body.

4. The housing as claimed in claim 1, wherein the housing door has at the upper side thereof a gripping element which is constructed as an angular member.

5. The housing as claimed in claim 1, wherein the housing body has in the inner space a module bar for fitting modules of the fire alarm and/or extinguishing control station, wherein the hinge device is arranged on a vertical side face of the housing body, and wherein the module bar is arranged adjacent to the side face opposite the hinge device.

6. The housing as claimed in claim 1, wherein the hinge device has two hinge elements, wherein each of the two hinge elements has two vertical rotation axes, and wherein the hinge elements are arranged at the inner side both on a side face of the housing body and on the housing door, wherein the hinge device enables vertical pivoting of the housing door in the open state.

7. A housing of a fire alarm and/or extinguishing control station, the housing comprising:

a housing body, which has an opening at a front side and which defines an inner space of the housing, a housing door for closing the opening of the housing body and a hinge device which is configured to enable opening and closing of the housing door, wherein the housing door has an outer side which faces an observer when the housing body is closed and an inner side opposite the outer side, wherein the housing door has at the outer side a display and/or operating component, wherein the hinge device has a first rotation axis internal the housing body and a parallel second rotation axis outside the housing body, wherein the hinge device is constructed in such a manner that the first rotation axis and the second rotation axis when the housing door is open can be rotated in opposing directions so that, when the housing is in the open state, the outer side of the housing door and the inner space of the housing face the observer at the same time, wherein the hinge device has a plurality of identical hinge elements, wherein a first group of the plurality of identical hinge elements are arranged at the inner space on a side face of the housing body and a second group of the plurality of hinge elements are arranged at the inner space on an opposing side face of the housing body, and wherein each of the plurality of the identical hinge elements comprises two parallel rotation axes and two parallel steps of different length.

8. The housing as claimed in claim 7, wherein the two parallel rotation axes comprise horizontal rotation axes and wherein the hinge device enables a parallel guiding of the housing door in a vertical direction.

9. The housing as claimed in claim 7, wherein an opening direction of the housing door is located in the width direction or in the height direction of the housing, and wherein a spacing between the first rotation axis and the second rotation axis is approximately 50% of the extent of the housing body in the width direction or in the height direction.

10. The housing as claimed in claim 7, wherein the housing body has around the opening a sealing edge which protrudes outward over the front side of the housing body.

11. The housing as claimed in claim 7, wherein the housing door has at the upper side thereof a gripping element which is constructed as an angular member.

12. The housing as claimed in claim 7, wherein the plurality of identical hinge elements comprise four identical hinge elements, each having two horizontal rotation axes, wherein the first group comprises two hinge elements and the second group comprises two hinge elements, and wherein the hinge device enables a parallel guiding of the housing door in a vertical direction.

13. The housing as claimed in claim 12, wherein the housing body has in the inner space a module bar for fitting modules of the fire alarm and/or extinguishing control station, wherein the hinge device is arranged on a vertical side face of the housing body, and wherein the module bar is arranged adjacent to the side face opposite the hinge device.

14. The housing as claimed in claim 1, wherein the hinge device comprises a plurality of hinge elements, each of the plurality of hinge elements having two vertical rotation axes.

15. The housing as claimed in claim 1, wherein the hinge device comprises a plurality of hinge elements, each of the plurality of hinge elements being parallel and spaced apart along the housing door.

* * * * *